United States Patent [19]
Köck et al.

[11] Patent Number: 5,568,504
[45] Date of Patent: Oct. 22, 1996

[54] SURFACE-EMITTING LASER DIODE

[75] Inventors: Anton Köck; Erich Gornik, both of München, Germany

[73] Assignee: Siemens Aktiengesellschaft, Munich, Germany

[21] Appl. No.: 448,428

[22] PCT Filed: Nov. 24, 1993

[86] PCT No.: PCT/EP93/03301

§ 371 Date: Jun. 5, 1995

§ 102(e) Date: Jun. 5, 1995

[87] PCT Pub. No.: WO94/13044

PCT Pub. Date: Jun. 9, 1994

[30] Foreign Application Priority Data

Dec. 3, 1992 [EP] European Pat. Off. ............ 92120671

[51] Int. Cl.⁶ ............... H01S 3/18; H01S 3/805; H01S 3/103; H01S 3/101
[52] U.S. Cl. .................................................. 372/96
[58] Field of Search .................... 372/96, 20, 24, 372/44

[56] References Cited

U.S. PATENT DOCUMENTS 4,874,953  10/1989  Katz .
5,008,893   4/1991  Amann et al. ............... 372/20

FOREIGN PATENT DOCUMENTS 0360011  3/1990  European Pat. Off. .
0442002  8/1991  European Pat. Off. .

OTHER PUBLICATIONS

E. Gornik et al., "Surface Plasmon Enhanced Light Emission in GaAs/AlGaAs Light Emitting Diodes", Proceedings SPIE, vol. 1362 Physical Concepts of Materials for Novel Optoelectronic Device Applications II: Device Physics and Applications (1990), pp. 1–13. (No month available).
Kan et al., "Beam–Scannable Light Source With the Grating Output Coupler", 2419 Japanese Journal of Applied Physics Supplements, 16th Int. Conf. Solid State Devices and Materials, (1984), Aug. 30–Sep. 1, Tokyo, Japan, pp. 141–144.
Japanese Abstract, "Semiconductor Light Generator", JP 60–123084, vol. 9, No. 280 E–356) (2003) Nov. 8, 1985.
Microelectronic Engineering, vol. 19, No. 1–4, Sep. 1992, pp. 57–59.

*Primary Examiner*—Rodney B. Bovernick
*Assistant Examiner*—Robert McNutt
*Attorney, Agent, or Firm*—Hill, Steadman & Simpson

[57] ABSTRACT

A tunable [tunable] surface-emitting laser diode in which in the manner of the TTG laser diode an active layer (5) and a tuning layer (3) are arranged transverse to one another between contact layers (2, 6) and are separated from one another by a central layer (4), with the result that given suitable doping of the surrounding semiconductor material these layers can be driven separately, and in which above a region provided for generating radiation the semiconductor material has on the surface a spatial periodic structure which is provided with a thin metallic film (7), with the result that during operation of the laser diode radiation is emitted directionally from the surface by means of exciting surface plasmon polaritons, and that this emission direction can be varied by tuning the wavelength of the radiation.

3 Claims, 3 Drawing Sheets

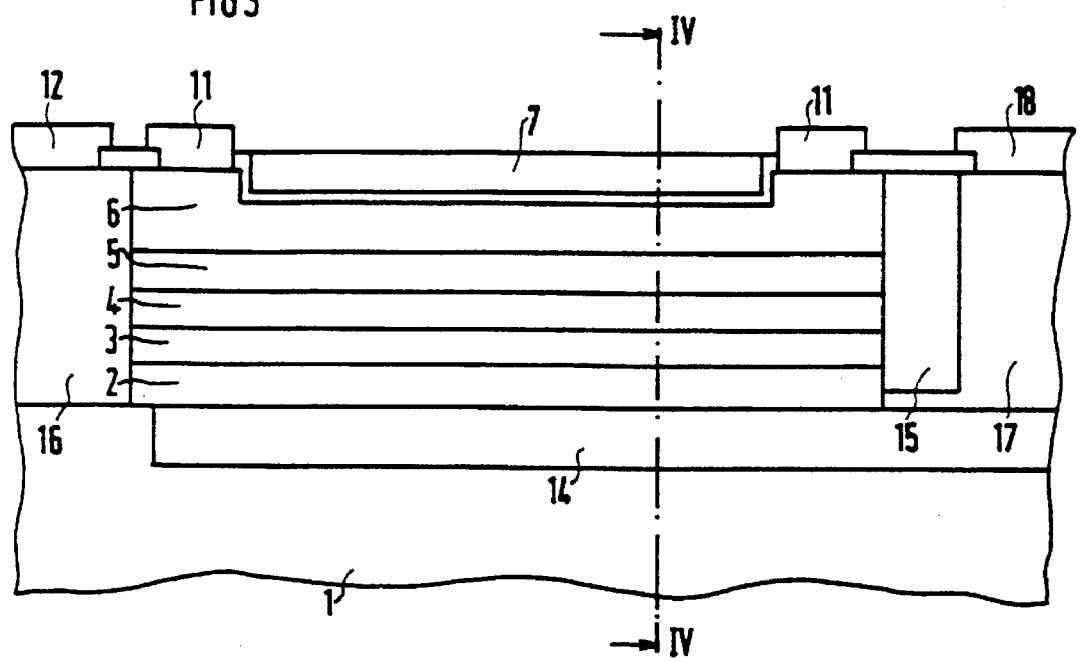
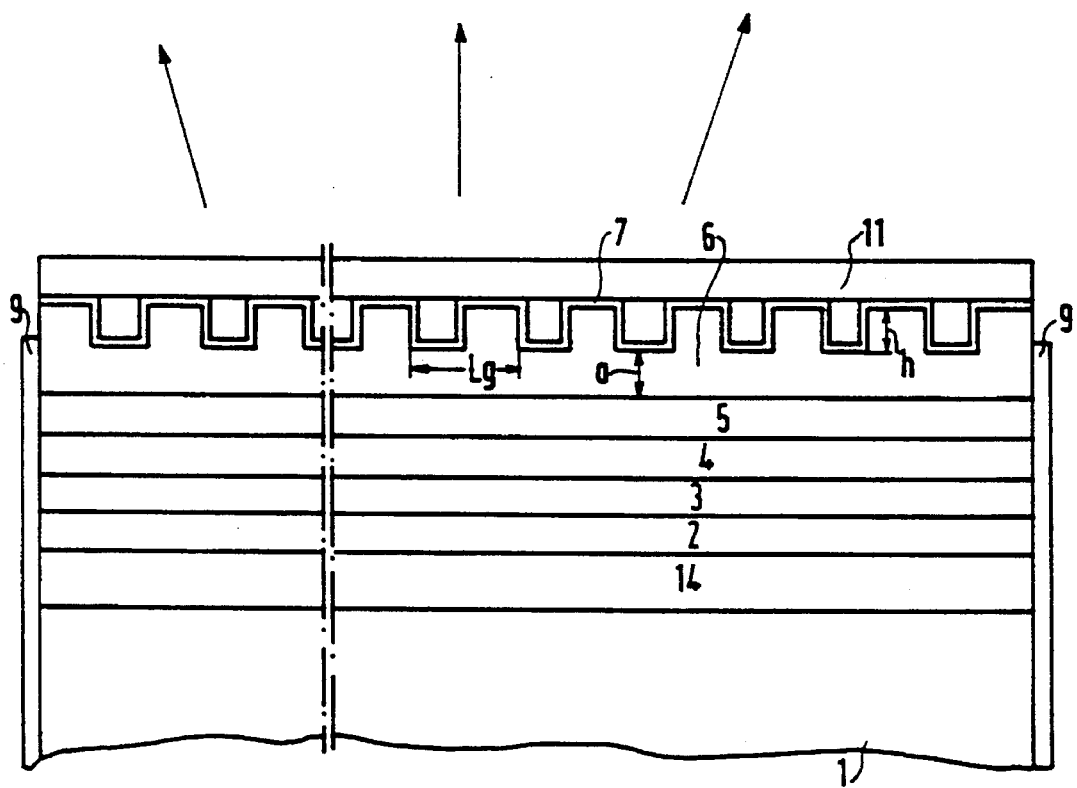

SURFACE-EMITTING LASER DIODE

BACKGROUND OF THE INVENTION

1. Field of the Invention

The present invention relates to a surface-emitting laser diode in which different emission directions can be realized.

2. Description of the Related Art

European Patent Document EP-A-0 442 002 describes a radiation-generating semiconductor component in which there are present on the surface of the semiconductor material spatial periodic structures which are coated with a thin metallic film. Surface plasmon polaritons are excited on the surface of this metallic film by photons generated in the active layer. An extremely focused emission from the surface is achieved by this excitation of surface modes. Surface plasmon polaritons are transverse electric (TE) or transverse magnetic (TM) surface modes which can propagate at the interface between two different media. The excitation of these modes requires a suitable periodic structure of the interface, which is formed in the case of the component described by a spatial structure, produced by etching, for example, of the semiconductor surface. The loss mechanisms which occur in conventional radiation-generating components and limit efficiency can be avoided, a greatly reduced line width of the emitted light and a drastic increase in the external quantum efficiency being achieved simultaneously. The emission takes place, in addition, with a defined polarization direction which is fixed by the arrangement and alignment of the periodic surface structure.

European Patent Document EP-A-0 360 011 describes a tunable DFB laser diode in which the active layer and the tuning layer are arranged transversely relatively to one another and can be driven separately via an intermediate layer which is located therebetween. This laser diode, known to experts as a TTG-DFB laser diode, has come to exist in the meantime in various modifications which relate, in particular, to various arrangements of the contacts required for the supply leads. Such diodes can be constructed on conductive and on semi-insulating substrates. The layer structure can be adapted in detail to the respective requirements, in particular in the case of the production of highly integrated components.

SUMMARY OF THE INVENTION

An object of the present invention is to provide a surface-emitting laser diode which emits in an extremely focused fashion and whose emission direction can be varied without varying the structural design or the arrangement of the diode.

This and other objects and advantages of the invention are achieved by means of the tunable laser diode having two layers which are separated by a central layer, are arranged parallel, and with reference to the planes of the layers, transverse to one another and are made from semiconductor materials having different energy band gaps, and of which one is provided as active layer and one as tuning layer and which are connected in an electrically conductive fashion to contacts in such a way that a separate current injection into the active layer and into the tuning layer can be performed, having a spatial periodic structure which is present in a region, arranged with reference to the planes of the layers in a fashion transverse to a region provided for generating radiation in the active layer, of the surface of an outermost semiconductor layer and is covered at least partially with a metallic film, the height of this structure and the length of in each case one period of the spatial periodic structure, the minimum distance of the metallic film from the active layer, and the thickness of the metallic film being dimensioned such that during operation of the laser diode surface modes are excited by photons generated in the active layer on the surface of the metallic film averted from the active layer, and having measures for achieving a laser resonance. Further embodiments of the invention provide that the measures for achieving a laser resonance comprise a DFB (distributed feedback) grating which is arranged parallel and with reference to the planes of the layers transverse to the active layer. Alternately, or additionally, the measures for achieving a laser resonance comprise reflecting end faces, arranged perpendicular to the planes of the layers, on two mutually opposite edges of the active layer. The measures for achieving a laser resonance comprise at least one reflective coating arranged parallel and with reference to the planes of the layers transverse to the active layer.

In a preferred embodiment, the metallic film is covered by a dielectric layer. The present invention achieves the object by the combination of a layer structure resembling the TTG laser diode with a surface configuration which permits the excitation of surface modes. This laser diode according to the invention is described below with the aid of various exemplary embodiments which are represented in FIGS. 1 to 6.

BRIEF DESCRIPTION OF THE DRAWINGS

FIGS. 1 to 3 respectively show an embodiment of the laser diode according to the invention, in cross section;

FIG. 4 shows a longitudinal section of the embodiment represented in FIG. 3.

DETAILED DESCRIPTION OF THE PREFERRED EMBODIMENTS

Figure 1:
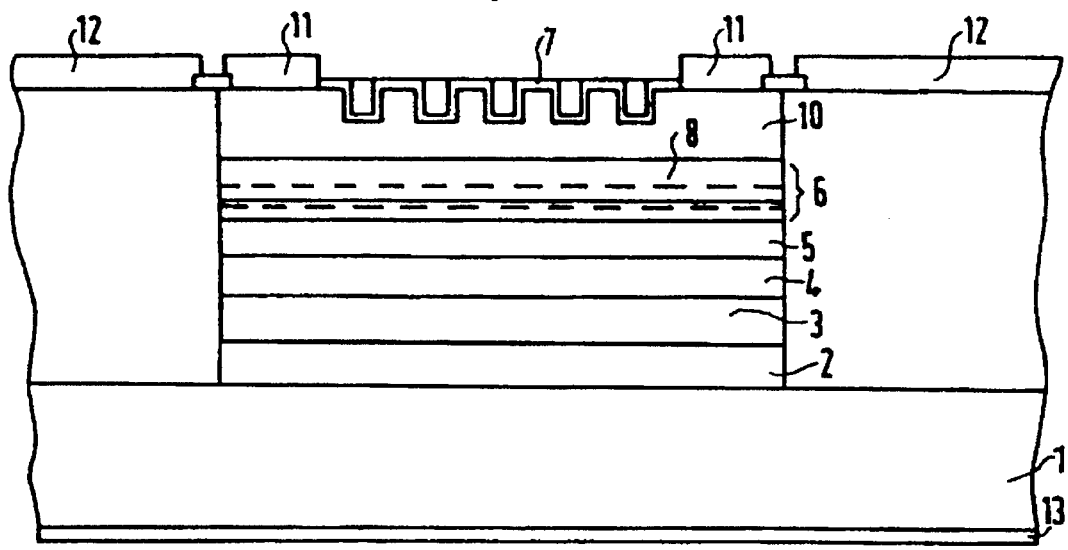

In the laser diode according to the invention, a tuning layer is provided transverse to an active layer. This tuning layer is distinguished from the active layer by the energy band gap of the semiconductor material used. It is achieved as a result that no radiation is generated in the tuning layer. The active layer and the tuning layer are arranged between doped semiconductor layers, these semiconductor layers being doped in such a way that currents can be injected separately into the active layer and into the tuning layer. For this purpose, it is the case, for example, that a central layer arranged between the active layer and the tuning layer is doped for one conductivity type, while two contact layers arranged respectively on the opposite side of the active layer and of the tuning layer are doped for the opposite conductivity type. If this central layer and the two contact layers are respectively connected separately from one another, for example via a conductively doped semiconductor material, to one contact each, controllable currents can be applied independently of one another to the active layer and to the tuning layer by applying suitable potentials to these contacts. Consequently, the wavelength of the radiation generated in the active layer can be tuned. The spatial periodic structure is arranged in the surface of the semiconductor material above the region provided for generating radiation in the active layer. It is then possible for surface modes which lead to emission of light from the surface to be excited on the outside of the thin metallic film, applied to surface, during operation of the laser diode. The emission direction is a function in this case of the wavelength of the light and of the periodic length of the structure. It is therefore possible, for a given periodic length, to vary the emission direction by changing the wavelength. A layer sequence which is shown in cross section is applied to a conductive substrate 1 in FIG. 1. The first step is to apply a lower contact layer 2. Located thereupon in sequence are the tuning layer 3, the central layer 4 and the active layer 5. An upper contact layer 6 contains a DFB distributed feedback grating 8. This contact layer 6 is covered by a cover layer 10 whose surface has the spatial periodic structure. The DFB grating 8 serves the purpose of producing laser resonance. Instead of this DFB grating 8, or in addition thereto, it is possible for there to be present at the longitudinal boundaries of the active layer 5 reflecting end faces to which reflective coatings may have been applied for silvering purposes, the result being that the laser resonator is a Fabry-Perot laser. The layer structure in FIG. 1 is bounded in strip form and laterally by semiconductor material. In this case, the cut extends transverse to the longitudinal direction of the strip. Located in the cover layer 10 is a two-dimensionally arranged periodic spatial structure as represented similarly in an oblique top view in FIG. 5. A thin metallic film 7, which is preferably silver, gold or aluminium, for example, is located on this structure. The periodic structure can also be present directly in the upper contact layer 6. The cover layer 10 is then superfluous. It is likewise possible for the arrangement of an active layer 5 and tuning layer 3 to be exchanged, that is to say the tuning layer is then arranged above the active layer with respect to the substrate 1. A DFB grating 8 can also be arranged at a different location within the layer sequence. A grating is superfluous in the presence of reflecting end faces. However, a grating can be present in addition or instead thereof, for example as a DBR distributed Bragg reflector grating. The lower contact layer 2 can likewise be eliminated when the current injection is performed through a conductive substrate 1. The thickness of the metallic film 7 is typically between 0.01 μm and 0.1 μm. The contacts 11, 12, 13 on the upper side or on the underside, averted from the layer sequence, of the substrate 1 are respectively applied to doped semi-conductor materials. In the exemplary embodiment of FIG. 1, the contact 11 is located on the semiconductor material connected in an electrically conductive fashion to the upper contact layer 6. The region which is arranged laterally relative to the strip having the layer sequence and to which the contact 12 is applied, and the central layer 4 are semiconductor material doped oppositely thereto. Just like the substrate 1, the lower contact layer 2 has a doping with the same sign as the upper contact layer 6. In order to avoid parasitic currents, additional insulation regions or blocking pn junctions, which are omitted in FIG. 1 for the purpose of clarity, can be arranged at various points having undesired pn junctions. In the case of the exemplary embodiment of FIG. 1, it is possible in the material system of GaAs, for example, for the substrate 1 to be GaAs, for the contact layers 2, 6 and the central layer 4 respectively to be AlGaAs, and for the tuning layer 3 and the active layer 5 respectively to be GaAs. The active layer 5 can also be a quantum well structure having a sequence of thin layers of different energy band gaps: in the exemplary embodiment, for example, layers alternately of GaAs and InGaAs. The cover layer 10 which is possibly present is likewise AlGaAs. The substrate 1 and the contact layers 2, 6 (possibly also the cover layer 10) are doped, for example, in a p-conducting fashion. The central layer 4 is doped in an n-conducting fashion in that case. Possible compositions are, for example, $(Al_{0.35}Ga_{0.65})As$ for the central layer 4 and, for example, $(Al_{0.3}Ga_{0.7})As$ for the contact layers 2, 6. Typical layer thicknesses are: 1000 nm, for example, for the lower contact layer 2, 250 nm, for example, for the tuning layer 3, 500 nm, for example, for the central layer 4, 90 nm, for example, for the active layer 5, and 400 nm to 1300 nm, for example, for the upper contact layer 6 in the exemplary embodiment the cover layer. The typical dimensions, illustrated in FIG. 4, of the grating-type structure of the surface are, for example, 1300 nm for the length Lg of the grating period, 100 nm for the height h of the structure (that is to say, the difference between the maximum and minimum distance of the metallic film 7 from the active layer 5), 25 nm, for example, for the thickness d of the metallic film 7, and between 100 and 500 nm, for example, for the thickness of a dielectric possibly applied to the metallic film 7. The resonator length, that is to say the distance from reflecting end face to reflecting end face, is 500 μm, for example, and the length of the structured region of the surface in the longitudinal direction of the resonator is 100 μm, for example.

Figure 2:
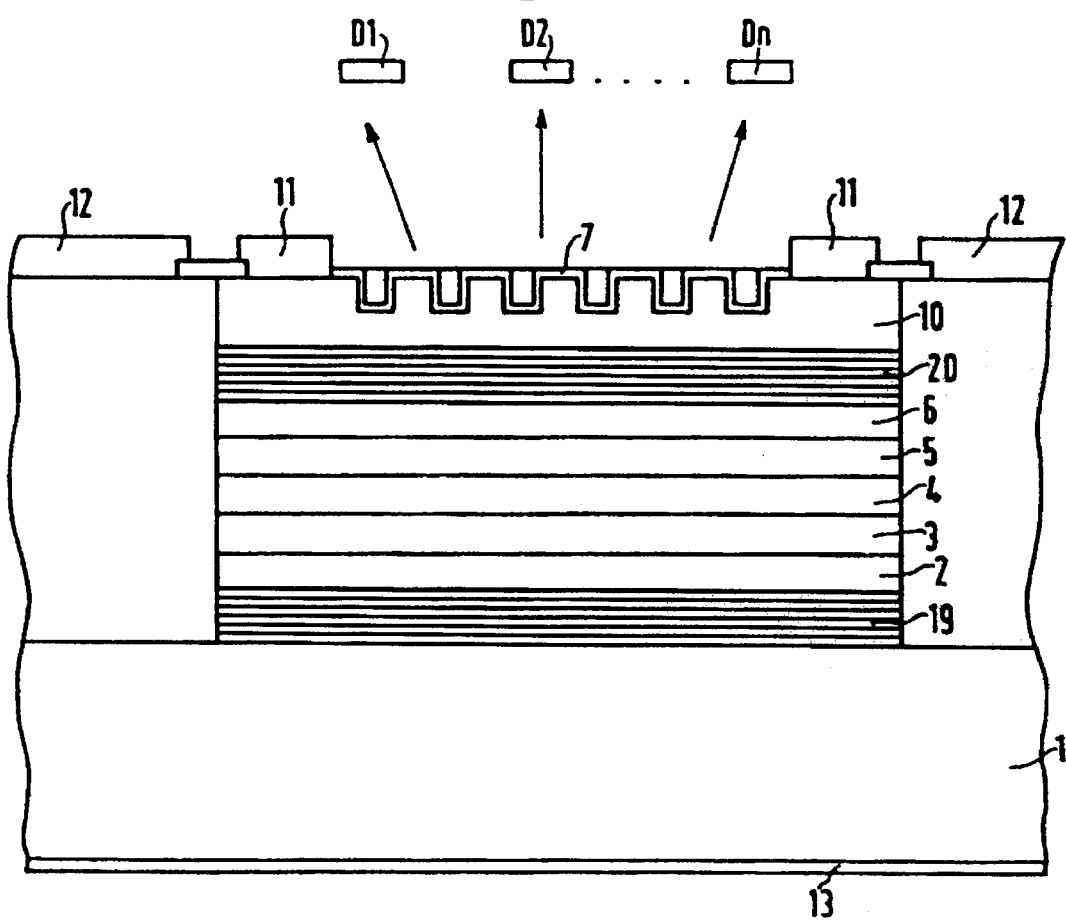

FIG. 2 shows an alternative embodiment, in which reflective coatings 19, 20 are arranged for the purpose of forming a vertical laser resonance respectively above and below the contact layers 2, 6. The upper reflective coating 20 can be eliminated if the metallic film 7 has an adequate reflective effect. As in FIG. 1, the lower contact layer 2, the tuning layer 3, the central layer 4, the active layer 5 and the upper contact layer 6 are arranged one above another between the reflective coatings 19, 20. Various emission directions which are possible by tuning the wavelength are indicated by the arrows. In addition, detectors D1, D2, . . . Dn, which are arranged in various emission directions, are illustrated in FIG. 2. Instead of the detectors, it is possible to provide glass fibers or connections for glass fibers into which the light emitted by the laser diode can respectively be directed. In principle, all the modifications as known from the TTG laser diode come into consideration for the part of the laser diode according to the invention which is provided for the tuning. As an example, FIG. 3 shows an arrangement in which all the contacts are arranged on the upper side, and the substrate 1 is a semi-insulating material. Furthermore, by way of example in the case of this laser diode a simplified design is represented in which the layer sequence comprises only the contact layer 2, the tuning layer 3, the central layer 4, the active layer 5 and the contact layer 6. The spatial periodic structure is located directly in the surface of this upper contact layer 6. As an alternative to the two-dimensional structure of FIGS. 1 and 2, a one-dimensional structure is shown here which has a periodic sequence in the longitudinal direction of the laser strip. Such a structure is represented in a detail in FIG. 6 in a perspective top view.

A longitudinal section belonging to FIG. 3 is represented in FIG. 4. The length Lg of the period of the structure, the height h of this structure and the minimum distance a of the metallic film 7 from the active layer 5 are illustrated in FIG. 4. Various emission directions are indicated once again by the arrows above. Reflective coatings are provided as reflecting end faces 9 in this laser diode.

In order to permit a separate supply of power to the active layer 5 and to the tuning layer 3, there is embedded in the semi-insulating substrate 1 a feed layer 14 which, for example, is produced by implanting dopant before the overgrowing. The contact 11 is located directly on the doped contact layer 6. The lower contact layer 2 is doped for the same type of conduction, as are the feed layer 14 and the lateral region 17 applied thereon. A contact 18 is located on this lateral region 17. The connection of the oppositely doped central layer 4 is performed via the correspondingly doped second lateral region 16, to which the contact 12 is applied. In the case of the use of a semi-insulating substrate, as well, all the modifications which are known from TTG laser diodes on a semi-insulating substrate are available individually for the laser diode according to the invention. Thus, in particular, the laser diode according to FIG. 3 can be supplemented by a DFB distributed feedback grating or by reflective coatings for constructing a vertical resonator. All the embodiments known to the person skilled in the art from the cited European Patent Document EP-A-0 442 002 come into consideration for the periodic structure of the surface. This structure is additionally illustrated by FIGS. 5 and 6 for the embodiments described with the aid of FIGS. 1 to 4. The periodic structure can be formed by trenches which are aligned parallel to one another and which, in the case of a laser diode having a horizontal resonator, do not extend in the propagation direction of the light in the resonator. The structure can be periodic in all directions in the plane of the active layer.

Figure 5:
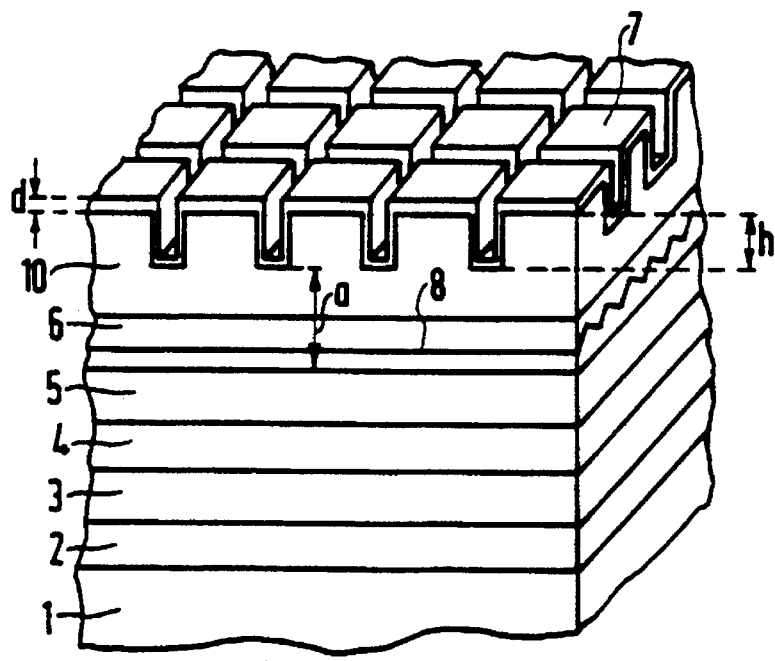
FIGS. 5 and 6 respectively show sectional top views of the laser diodes of FIGS. 1 and 3, respectively.
Figure 6:
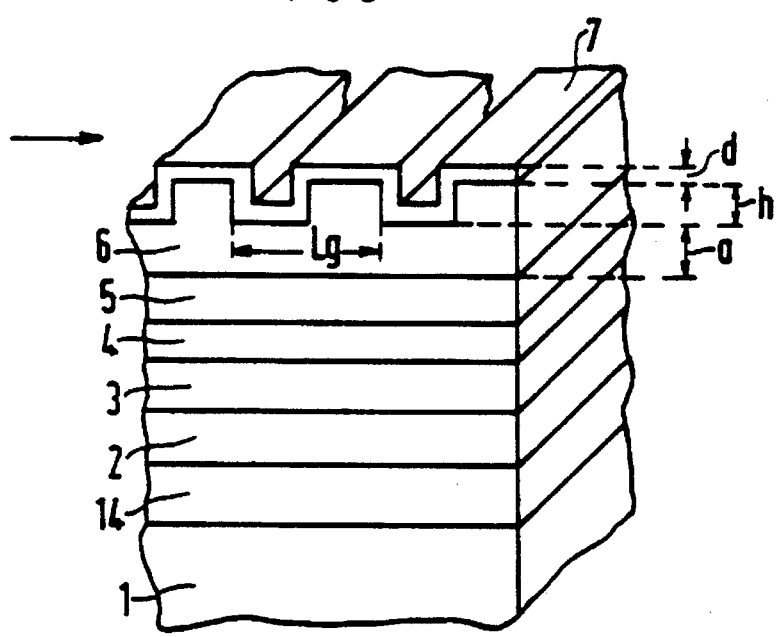

This is the case, for example, for a cruciform arrangement of trenches or webs. Two families of trenches or webs arranged parallel to one another and respectively at the same distances from the adjacent trenches or webs are, for example, arranged perpendicular to one another. What are then to be regarded as the periodic length in the sense of the claims are the dimensions which are characteristic of the property of the surface modes, that is to say the lengths of the periodicity in the two directions which are respectively perpendicular to a family of trenches or webs. The DFB grating 8 is also illustrated in FIG. 5, the frontal view perpendicular to the plane of the drawing in FIG. 5 corresponding to the frontal view perpendicular to the plane of the drawing in FIG. 1. The frontal view of FIG. 6 is a detail from FIG. 4. The direction of view denoted by the arrow in FIG. 6 delivers a corresponding detail from FIG. 3.

The relevant possibilities remain open for structuring the active layer 5 and the tuning layer 3. In particular, the tuning layer 3 can have a quantum well structure.

In order to excite surface modes of higher order (surface plasmon polaritons), the metallic film 7 can be covered by a dielectric layer.

In the case of a laser diode having a strip-shaped horizontal resonator by means of which a propagation direction of the light is fixed in the plane of the active layer, the emission results owing to excitation of surface modes in the plane which is fixed by this propagation direction and the perpendicular to the plane of the layer, if the structure of the surface is periodic primarily in the propagation direction. This is the case, for example, for structuring by trenches or webs which extend perpendicular to the longitudinal direction of the resonator. If the structure of the surface, by contrast, is similar but turned, the emission then takes place in that plane which is fixed by the perpendicular to the plane of the layer and by the direction of the shortest periodicity of the structure, that is to say in a correspondingly turned plane. Consequently, it is possible by aligning the structure of the surface to undertake an alignment of the emission directions, which can be controlled by tuning the wavelength, relative to the laser diode. The focusing of the radiation which is emitted upon excitation of surface modes is so good that it is possible for a precisely defined emission direction to be maintained very well using the laser diode according to the invention. Even a slight change in the wavelength, that is to say by means of a slight change in the corresponding control voltage, enables a marked change in the emission direction. Small voltage changes therefore cause clearly measurable angular variations in the emission direction. It is thus possible to realise in a simple way a light-emitting component having an electrically variable emission angle. Various emission directions can be realised using the same laser diode, without the need to take appropriate precautions for each emission direction in the structural design of the laser diode, or even without the need to turn the laser diode as a whole.

Although other modifications and changes may be suggested by those skilled in the art, it is the intention of the inventors to embody within the patent warranted hereon all changes and modifications as reasonably and properly come within the scope of their contribution to the art.

We claim:

1. A tunable surface-emitting laser diode, comprising:

a central layer;

two layers separated by said central layer, said two layers being arranged parallel, and with reference to planes of said two layers, transverse to one another and being made from semiconductor materials having different energy band gaps, and of which one is provided as an active layer and one as a tuning layer;

contacts connected in an electrically conductive fashion to said two layers in such a way that a separate current injection into the active layer and into the tuning layer can be performed;

a semiconductor layer on said two layers and having a surface defining a spatial periodic structure which is present in a region, arranged with reference to the planes of said two layers in a fashion transverse to a region provided for generating radiation in the active layer;

a metallic film at least partially covering said spatial periodic structure;

said spatial periodic structure being of a height and a length of each period of said spatial periodic structure, a minimum distance of said metallic film from the active layer, and a thickness of said metallic film being dimensioned such that during operation of the laser diode surface modes are excited by photons generated in the active layer on a surface of said metallic film averted from the active layer, and means for achieving laser resonance during operation of said laser diode, said means for achieving a laser resonance comprising at least one reflective coating arranged parallel and with reference to the planes of said two layers transverse to the active layer.

2. A tunable surface-emitting laser diode as claimed in claim 1, wherein said means for achieving laser resonance comprise a DFB grating which is arranged parallel and with reference to the planes of said two layers transverse to the active layer.

3. A tunable surface-emitting laser diode as claimed in claim 1, further comprising:

a dielectric layer covering said metallic film.

* * * * *